United States Patent
Hyon et al.

(10) Patent No.: US 10,161,036 B2
(45) Date of Patent: Dec. 25, 2018

(54) SUBSTRATE PROCESSING APPARATUS

(71) Applicant: EUGENE TECHNOLOGY CO., LTD., Yongin-Si, Gyeonggi-Do (KR)

(72) Inventors: Jun Jin Hyon, Gunpo-Si (KR); Sung Tae Je, Yongin-Si (KR); Byoung Gyu Song, Yongin-Si (KR); Yong Ki Kim, Osan-Si (KR); Kyoung Hun Kim, Yongin-Si (KR); Chang Dol Kim, Yongin-Si (KR); Yang Sik Shin, Yongin-Si (KR); Jae Woo Kim, Bucheon-Si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 135 days.

(21) Appl. No.: 15/220,383

(22) Filed: Jul. 26, 2016

(65) Prior Publication Data
US 2017/0073810 A1     Mar. 16, 2017

(30) Foreign Application Priority Data
Sep. 11, 2015   (KR) .................. 10-2015-0128970

(51) Int. Cl.
*C23C 16/44*       (2006.01)
*C23C 16/455*     (2006.01)
*C23C 16/458*     (2006.01)

(52) U.S. Cl.
CPC ........ *C23C 16/4412* (2013.01); *C23C 16/455* (2013.01); *C23C 16/45563* (2013.01)

(58) Field of Classification Search
None
See application file for complete search history.

(56) References Cited

U.S. PATENT DOCUMENTS

| 4,992,301 A * | 2/1991 | Shishiguchi | ............ C30B 25/12 |
| | | | 118/724 |
| 2009/0197424 A1* | 8/2009 | Sakai | .................... C23C 16/405 |
| | | | 438/758 |

FOREIGN PATENT DOCUMENTS

| CN | 103946956 A | 7/2014 |
| CN | 103959440 A | 7/2014 |
| JP | 3255618 A | 11/1991 |
| JP | 2009206489 A | 9/2009 |
| JP | 2009218600 A | 9/2009 |
| JP | 201080924 A | 4/2010 |
| JP | 201274560 A | 4/2012 |
| JP | 2014534644 A | 12/2014 |
| JP | 2015504601 A | 2/2015 |

(Continued)

Primary Examiner — Jethro M. Pence
(74) Attorney, Agent, or Firm — Renaissance IP Law Group LLP

(57) ABSTRACT

The present invention may include: a tube providing an interior space in which substrates are processed; a substrate support portion stacking a plurality of substrates in the interior space of the tube in multi-level; a gas supply portion supplying a process gas to the plurality of substrates; an exhaust portion disposed to face the gas supply portion to absorb the process gas; and a flowage adjustment portion having spray openings formed along a circumference of the tube between the gas supply portion and the exhaust portion to spray an adjusting gas, and may be capable of controlling the amount of process gas supplied to an upper surface of the substrate by adjusting the flowage of process gas.

9 Claims, 6 Drawing Sheets

190 : 191, 192, 193

(56) References Cited

FOREIGN PATENT DOCUMENTS

KR     20110005073 A    1/2011
KR       101463592 B1   11/2014

* cited by examiner

190 : 191, 192, 193

190 : 191, 192, 193

US 10,161,036 B2

SUBSTRATE PROCESSING APPARATUS

CROSS-REFERENCE TO RELATED APPLICATION

This application claims priority to and the benefit of Korean Patent Application No. 10-2015-0128970 filed in the Korean Intellectual Property Office on Sep. 11, 2015, the entire contents of which are incorporated herein by reference.

TECHNICAL FIELD

The present invention disclosed herein relates to a substrate processing apparatus, and more particularly, to a substrate processing apparatus capable of controlling the amount of process gas supplied to an upper surface of the substrate by adjusting the flowage of process gas.

BACKGROUND ART

Typically, a substrate processing apparatus may be classified into a single wafer type substrate processing apparatus in which a substrate processing process is performed on one substrate and a batch type substrate processing apparatus in which a substrate processing process is performed on a plurality of substrates at the same time. The single wafer type substrate processing apparatus has an advantage in that its structure is simple. However, the single wafer type substrate process apparatus may be deteriorated in productivity. Thus, the batch type substrate processing apparatus is popular because of mass production capability.

A batch type substrate processing apparatus may include a processing room for receiving and processing substrates stacked in multi-level in a horizontal direction, a process gas supply nozzle for supplying a process gas into the processing room, and an exhaust line for evacuating the processing room. A substrate processing process using such a batch type substrate processing apparatus may be performed as follows: first, a plurality of substrates are carried into the processing room; next, interior of the processing room is exhausted via exhaust line and a process gas is supplied into the processing room via a process gas supply nozzle; next, the process gas sprayed from the process gas supply nozzle is passed between substrates and is flowed into the exhaust line through an exhaust opening while a thin film is formed on the substrate.

However, in a conventional substrate processing apparatus, some of process gas may not pass the upper surface of the substrate but move along a circumference of the substrate to be absorbed into the exhaust line. That is, the process gas moving along the circumference of the substrate may not actually participate in the processing process and is absorbed into the exhaust line. Thus, the process gas may be wasted and efficiency of processing process on a substrate may be declined.

RELATED ART DOCUMENT

Patent Document 1: Korean Patent No. 10-1463592 B1

The above information disclosed in this Background section is only for enhancement of understanding of the background of the disclosure and it may therefore contain information that does not form the prior art that is already known to a person of ordinary skill in the art.

DISCLOSURE

Technical Problem

The present invention provides a substrate processing apparatus capable of adjusting a flowage of a process gas.

The present invention provides a substrate processing apparatus capable of improving efficiency of substrate processing process.

Further object of the present invention will become evident with reference to following detailed descriptions and accompanying drawings.

Technical Solution

Embodiments of the present invention may include: a tube providing an interior space in which substrates are processed; a substrate support portion stacking a plurality of substrates in the interior space of the tube in multi-level; a gas supply portion supplying a process gas to the plurality of substrates; an exhaust portion disposed to face the gas supply portion to absorb the process gas; and a flowage adjustment portion having spray openings formed along a circumference of the tube between the gas supply portion and the exhaust portion to spray an adjusting gas.

Some embodiments of the present invention may further include an exterior tube accommodating the tube therein, and the flowage adjustment portion may be disposed between the tube and the exterior tube.

Other embodiments of the present invention may include a plurality of isolation plates each disposed between the substrates along a loaded direction of the substrates to divide the processing spaces for processing each of the plurality of substrates, and a plurality of spray openings may be formed on the tube at different heights corresponding to each of the processing spaces.

The flowage adjustment portion may include a duct installed on an exterior surface of the tube to provide a flowage space for the adjusting gas to move to the spray openings and an adjusting gas supply line connected to the duct to supply the adjusting gas.

The flowage adjustment portion may include a spray unit disposed inside of the duct to spray the adjusting gas inside of the duct corresponding to each of the processing spaces and connected to the adjusting gas supply line.

The spray openings may be formed on both sides of the tube and may be disposed to face each other.

The spray openings are formed in a shape of slit or in a shape of a plurality of holes disposed in line.

The spray openings may be changed in width as going from the gas supply portion to the exhaust portion.

The plurality of spray openings may have different area according to height.

The plurality of spray openings are disposed at the same height as each of a plurality of spray nozzles spraying the process gas of the gas supply portion.

Advantageous Effects

According to the exemplary embodiments of the present invention, the flowage of the process gas may be adjusted by including the flowage adjustment portion on the substrate processing apparatus. That is, the flowage adjustment portion may adjust the flowage of the process gas from a movement along the circumference of the substrate to a movement toward the central portion of the substrate. Thus, most of the process gas may participate in processing process for the substrate and the amount of wasted process gas may be decreased. Therefore, efficiency of substrate processing process may be improved.

BEST MODE

Figure 1:
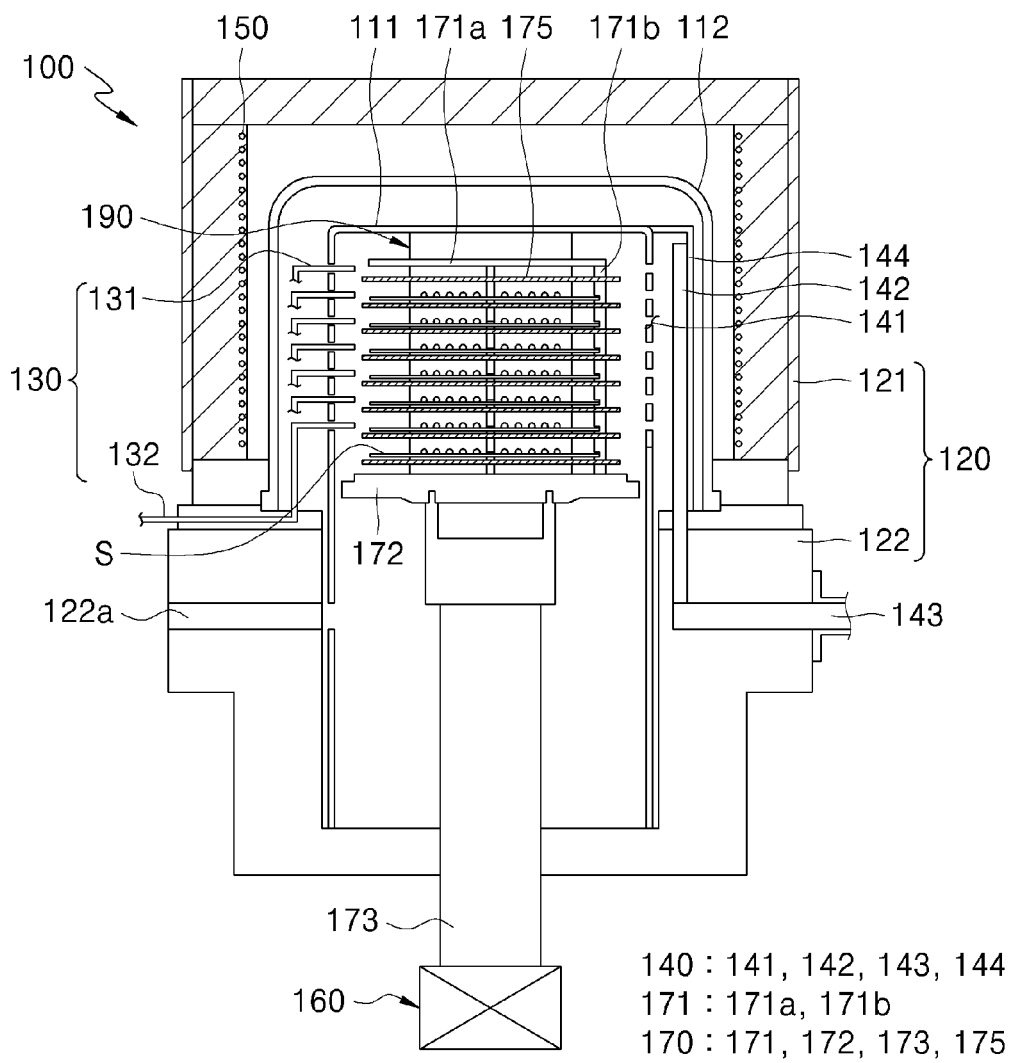
FIG. 1 is a view of a structure of a substrate processing apparatus according to an embodiment of the present invention.

Hereinafter, exemplary embodiments of the present invention will be described more fully with reference to the accompanying drawings. However, the present invention may be embodied in many different forms, and should not be construed as being limited to the embodiments set forth herein. Rather, these embodiments are provided so that this disclosure will be thorough and complete and will fully convey the scope of the present invention to those skilled in the art. The drawings may be exaggerated for a detailed description of the disclosure. Like reference numerals in the drawings designate like elements.

Figure 2:
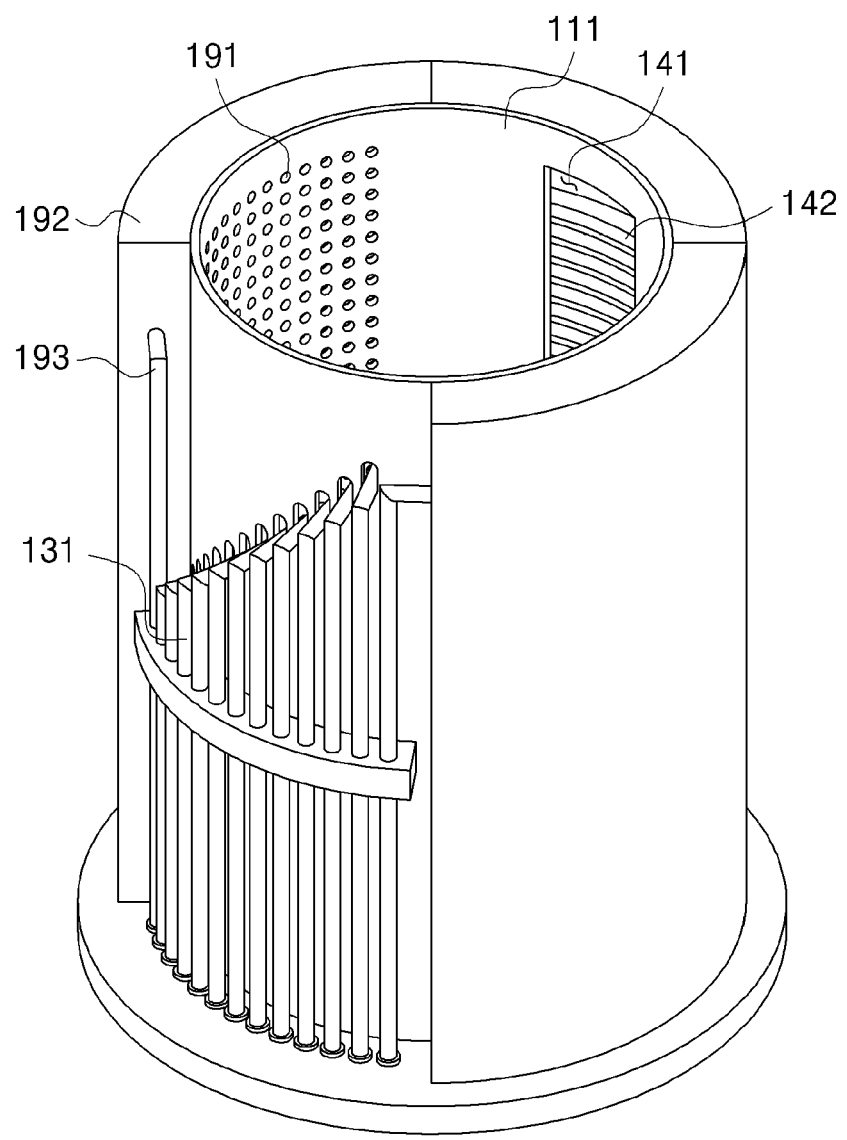
FIG. 2 is a view illustrating a gas supply portion and a flowage adjustment portion according to an embodiment of the present invention.
Figure 3:
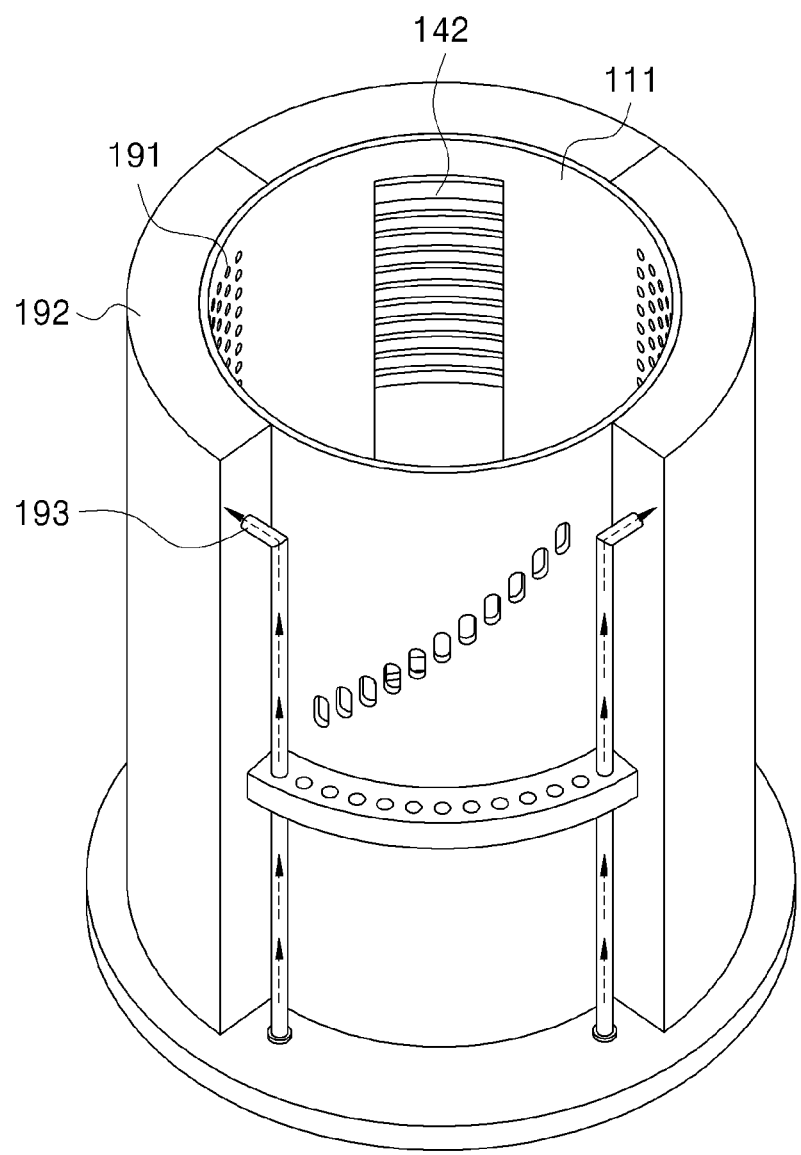
FIG. 3 is a perspective view illustrating the flowage adjustment portion according to an embodiment of the present invention.
Figure 4:
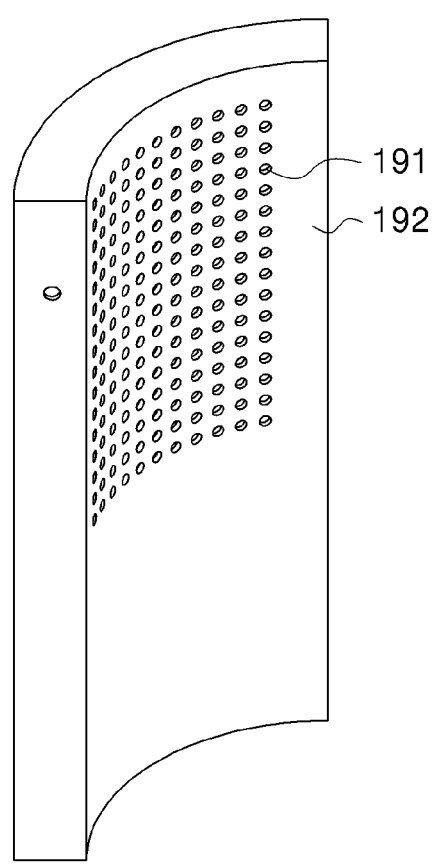
FIG. 4 is a view illustrating spray openings and a duct according to an embodiment of the present invention.
Figure 5:
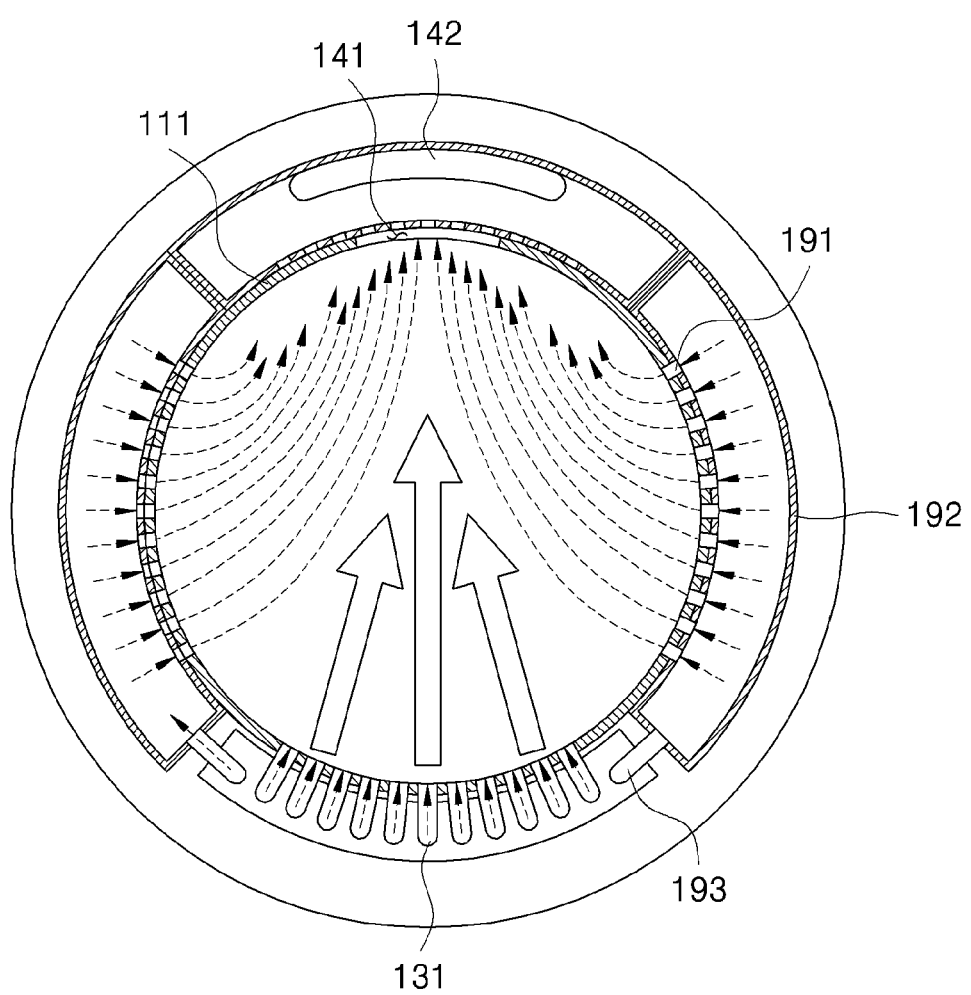
FIG. 5 is a view illustrating operation of the flowage adjustment portion according to an embodiment of the present invention.
Figure 6:
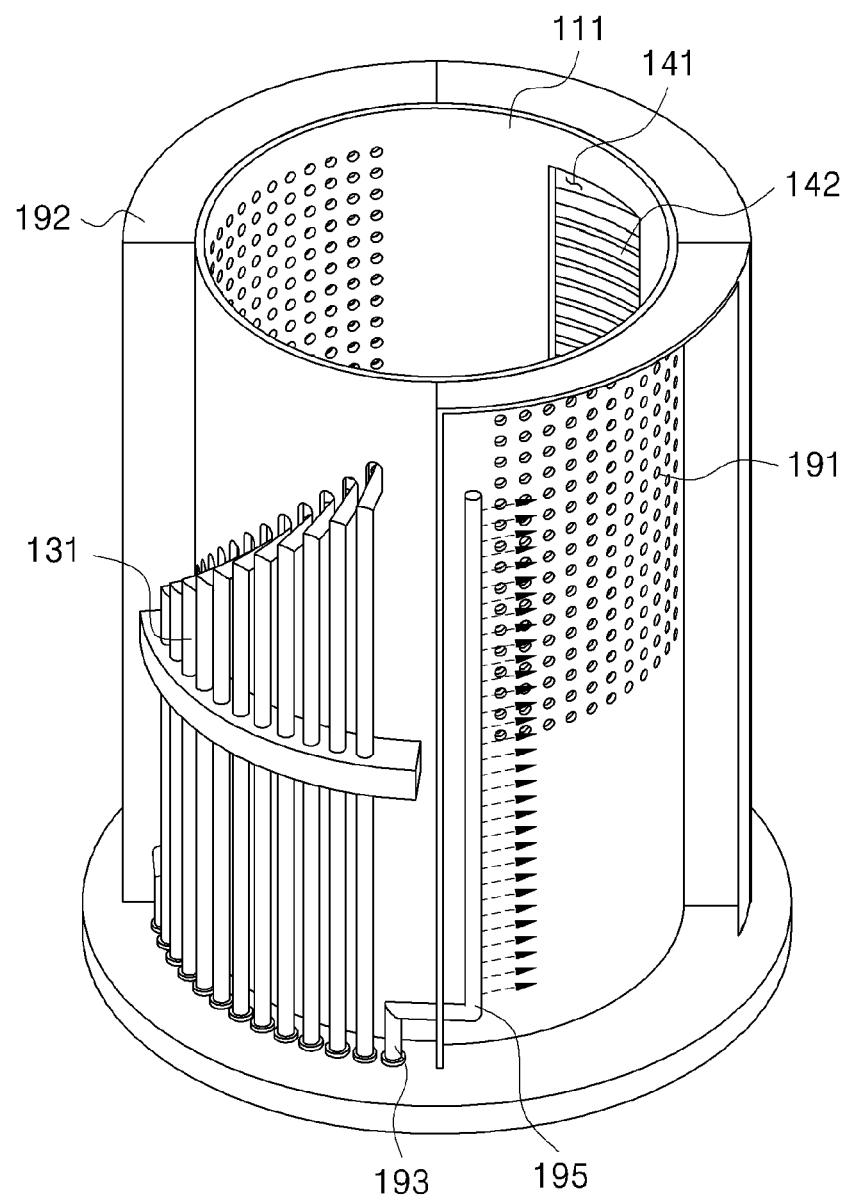
FIG. 6 is a perspective view illustrating a flowage adjustment portion according to another embodiment of the present invention.

FIG. 1 is a view of a structure of a substrate processing apparatus according to an embodiment of the present invention; FIG. 2 is a view illustrating a gas supply portion and a flowage adjustment portion according to an embodiment of the present invention; FIG. 3 is a perspective view illustrating the flowage adjustment portion according to an embodiment of the present invention; FIG. 4 is a view illustrating spray openings and a duct according to an embodiment of the present invention; FIG. 5 is a view illustrating operation of the flowage adjustment portion according to an embodiment of the present invention; and FIG. 6 is a perspective view illustrating a flowage adjustment portion according to another embodiment of the present invention.

Referring to FIG. 1 and FIG. 2, a substrate processing apparatus 100 according to an embodiment of the present invention may include: a tube 111 providing an interior space in which substrates S are processed; a substrate support portion 170 stacking a plurality of substrates S in the interior space of the tube 111 in multi-level; a gas supply portion 130 supplying a process gas to the plurality of substrates S; an exhaust portion 140 disposed to face the gas supply portion 130 to absorb the process gas; and a flowage adjustment portion 190 having spray openings 191 formed along a circumference of the tube 111 between the gas supply portion 130 and the exhaust portion 140 to spray the adjusting gas.

Here, the substrate processing apparatus 100 according to an embodiment of the present invention may be an epitaxial apparatus to form epitaxial layers on the substrates S. In case that a Selective Epitaxial Growth (SEG) process is made progress on the substrates S, the process gas may be supplied to all the processing spaces. The process gas may include at least one of raw material gas, etching gas, dopant gas, and carrier gas, and gases may be mixed and supplied in various ratio to control the thickness of the thin film on the substrates S.

Since gases have different molecular weights, the flowage of the process gas may vary according to ratio. Thus, the current or flow of the process gas may be a key factor for determination of thickness and composition of the thin film on the substrates S in a selective epitaxial growth. The process gas sprayed to the substrates S may move, for example, along a circumference of the substrates S and along a lower surface of the substrates S as well as along an upper surface of the substrates S. Thus, only some portion of the process gas supplied to the upper surface of the substrates S may actually participate in the processing process for the substrates S and other portion of the gas may not actually participate in the processing process for the substrates S. Thus, the flowage adjustment portion 190 may be included to adjust the current of the process gas to control more process gas to be supplied to the upper surface of the substrates S.

A chamber 120 may be formed in the shape of a rectangular barrel or in the shape of a cylinder. The chamber 120 may include an upper body 121 and a lower body 122, and a lower portion of the upper body 121 and an upper portion of the lower body 122 communicate each other. A side portion of the lower body 122 may have an entrance allowing incoming and outgoing of the substrates S. Thus, substrates S may be loaded into the chamber 120 through the entrance. And the substrates S loaded inside of the lower body 122 may be moved upward to be processed in the upper body 121. Thus, the interior of the lower body 122 may form a loading space wherein the substrates S are loaded and the interior of the upper body 121 may form a processing space for substrates S. However, the structure and shape of the chamber 120 may not be limited to the above and may be various.

The exterior tube 112 may be formed in a cylinder shape, and may be disposed at the upper side of the lower body 122 of which an upper portion may be open or may be disposed at interior of the upper body 121. A space for accommodation of the tube 111 may be formed interior of the exterior tube 112 and the lower side may be open. Here, an inner wall of the exterior tube 112 and an outer wall of the tube 111 are separated, by which a space may be formed between the exterior tube 112 and the tube 111. However, the structure and shape of the exterior tube 112 may not be limited to the above and may be various.

The tube 111 may be formed in a cylinder shape, and may be disposed in the exterior tube 112. A space capable of accommodating the substrates S may be formed in the tube 111 the lower side of which may be open. Thus, interior of the tube 111 may communicate with interior of the lower body 122 for the substrates S to move between the tube 111 and the lower body 122. However, the structure and shape of the tube 111 may not be limited to the above and may be various.

The substrate support portion 170 may include a substrate holder 171, a blocking plate 172 for sealing interior of the tube 111, a shaft 173, and a plurality of isolation plates 175 each disposed between the substrates S along a loaded direction of the substrates S to divide the processing spaces for processing each of the plurality of substrates S.

The substrate holder 171 may be formed to stack the plurality of substrates S in a vertical direction. The substrate holder 171 may include a plurality of support bars 171*b* formed to stretch in a vertical direction and an upper plate connected to the support bars to support the same. Support tips for easy supporting the substrates S are formed on the support bars to protrude toward the center of the substrates S.

The upper plate 171*a* may be formed in a disk shape and may have a diameter lager than that of the substrates S. The support bars 171*b* may be provided three and may be separated along the circumference of the upper plate 171*a* to be connected to a lower side of an outskirts portion of the upper plate. The support tips may be provided in plurality and may be separately disposed in line along a longitudinal direction of the support bars 171*b*. Thus, the substrate holder 171 may form a plurality of layers on which substrates S are stacked in a vertical direction. Therefore, one substrate S may be loaded on each single layer (or a single processing space). However, the structure and shape of the substrate holder 171 may not be limited to the above and may be various.

The blocking plate 172 may be formed in a disk shape and may have a diameter lager than that of the substrate holder 171. The blocking plate 172 may be connected to a lower side of the substrate holder 171. Therefore, in case that the substrate holder 171 moves from the lower body 122 into the tube 111, the blocking plate 172 moves upward with the substrate holder 171 to close an open lower side of the tube 111. Thus, while a processing process for the substrates S is in progress, interior of the tube 111 may be sealed against the lower body 122. Therefore, an inflow of the process gas in the tube 111 to the lower body 122 or an inflow of foreign matter in the lower body 122 to the tube 111 may be prevented. However, the structure and shape of the blocking plate 172 may not be limited to the above and may be various.

The shaft 173 may be formed in a bar shape extending in a vertical direction. An upper end of the shaft 173 may be connected to the blocking plate 172 and a lower end of the shaft 173 may be connected to a driving portion 160. Thus, the substrate holder 171 may be rotated by the driving portion 160 about a center axis of the shaft 173 in a vertical direction and may be moved vertically along the shaft 173 by the driving portion 160.

The isolation plates 175 may be formed in a disk shape and may be provided in plurality for being disposed at lower sides of the support tips. That is, the isolation plates 175 may be fitted by the support bars and may be separately disposed between the support tips. Thus, the isolation plates 175 may divide the spaces in which each of the substrates S is processed. Therefore, processing spaces may be formed individually at each of layers of the substrate holder 171.

The driving portion 160 may include a vertical actuator for moving the substrate support portion 170 vertically and a rotation actuator for rotating the substrate support portion 170.

The vertical actuator may be a cylinder, may be connected to a lower side of the substrate support portion 170 or the shaft 173, and may take a role of moving the substrate support portion 170 vertically. Thus, the substrate support portion 170 loading the substrates S may move between the tube 111 and the lower body 122. That is, after the vertical actuator moves the substrate support portion 170 downward, substrates S may be received onto the substrate support portion 170 through the entrance of the lower body 122. And after all the substrates S are received onto the substrate support portion 170, the vertical actuator may move the substrate support portion 170 into the tube 111 at the upper side. And then, a processing process for the substrates S may be performed.

The rotation actuator may be a motor, may be connected to a lower side of the substrate support portion 170 or the shaft 173, and may take a role of rotating the substrate support portion 170. When the substrate support portion 170 is rotated using the rotation actuator, the process gas moving to pass the substrates S loaded on the substrate support portion 170 may be mixed and may be distributed uniformly on the upper side of the substrates S. Thus, quality of the film deposed on the substrates S may be improved. However, the method by which the driving portion 160 may move the substrate support portion 170 vertically or may rotate the substrate support portion 170 may not be limited to the above and may be various.

A heating portion 150 may be a heater disposed at outer side of the exterior tube 112. For example, the heating portion 150 may be inserted and installed on an inner wall of the upper body 121 and may be disposed as enclosing a side portion and the upper side of the exterior tube 112. Thus, the thermal energy generated by the heating portion 150 may raise the temperature of interior of the tube 111 through the exterior tube 112. Therefore, the heating portion 150 may be controlled to adjust the temperature of interior of the tube 111 to be a temperature for easy processing for substrates S. However, the position on which the heating portion 150 is installed may not be limited to the above and may be various.

Referring to FIG. 2, the gas supply portion 130 may include a plurality of spray nozzles 131 for spraying the process gas to the substrates S of interior of the tube 111 and a process gas supply line 132 connected to the spray nozzles 131 to supply the process gas.

The spray nozzles 131 may be installed and inserted to pass through one side of the tube 111, for example, through an inner wall of foreside of the tube 111 and may be disposed at a different height each. That is, the spray nozzles 131 may be disposed in a vertical direction each corresponding to each processing spaces in which each of the substrates may be processed as divided by the isolation plates 175. Thus, the amount of the process gas supplied to each of the processing spaces may be controlled individually.

The process gas supply line 132 may be formed in a pipe shape, one end of which may be connected to the spray nozzles 131 and the other end of which may be connected to a process gas supply source (not shown). Thus, the process gas supplied from the process gas supply source may be supplied to the spray nozzles 131 through the process gas supply line 132. For example, the process gas supply line 132 may be provided in plurality, each of which may be connected to each of spray nozzles 131, or one process gas supply line 132 may be diverged in plurality, each of which may be connected to each of spray nozzles 131. And one or a plurality of control valves may be provided to the process gas supply line 132 to control the amount of the process gas supplied to the spray nozzles 131. However, the structure and shape of the process gas supply line 132 may not be limited to the above and may be various.

The exhaust portion 140 may include exhaust openings 141 in which the gas of interior of the tube 111 may flow, an exhaust ports 142 for absorbing the gas passing through the exhaust openings 141, an exhaust line 143 which is connected to the exhaust ports 142 to exhaust the gas absorbed in the exhaust ports 142 to the exterior of the tube 111, and an exhaust duct 144 accommodating the exhaust ports 142.

The exhaust openings 141 may be formed on the other side of the tube 111, for example, on an inner wall of backside of the tube 111 facing the spray nozzles 131. The exhaust openings 141 may be provided extending in a vertical direction or may be provided in plurality to be disposed at different heights. That is, each of a plurality of the exhaust openings 141 may be disposed in a vertical direction corresponding to each of the spray nozzles 131. Thus, the process gas supplied from the spray nozzles 131 may flow to the exhaust openings 141 positioned at an opposite side through the processing spaces. Therefore, a sufficient time for reaction between the process gas and a surface of the substrates S may be secured. Here, non-reaction gas and reaction byproducts generated during the substrate processing process may be absorbed and released through the exhaust openings 141.

The exhaust ports 142 may be installed corresponding to the exhaust openings 141 on outer side of the tube 111. A space for the gas to move may be provided interior of the exhaust ports 142 and absorbing holes may be formed at a portion facing the exhaust openings 141. Thus, the gas passed through the exhaust openings 141 may flow in the interior of the exhaust ports 142 through the absorbing holes. The absorbing holes may be provided one or in plurality corresponding to the exhaust openings 141 or each of the processing spaces. However, the structure and shape of the exhaust ports 142 may not be limited to the above and may be various.

The exhaust line 143 may be formed in a pipe shape, one end of which may be connected to the exhaust ports 142 and the other end of which may be connected to an absorber (not shown). Thus, the gas of interior of the tube 111 may pass through the exhaust openings 141, may be absorbed in the exhaust ports 142, and may be released to exterior of the tube 111 along the exhaust line 143 by an absorbing force provided by the absorber. However, the structure and shape of the exhaust line 143 may not be limited to the above and may be various.

The exhaust duct 144 may form a space in which the exhaust ports 142 may be received, and may be installed on the other side of the tube 111, for example, on the backside of the tube 111. And the exhaust duct 144 may be disposed between the tube 111 and the exterior tube 112. Thus, the exhaust duct 144 may block the gas being absorbed to the exhaust ports 142 from flowing out to a space between the tube 111 and the exterior tube 112.

On the other hand, the spray nozzles 131 and the exhaust openings 141 may be disposed between the tube 111 and the exterior tube 112. Thus, the interior of the tube 111 may be sealed double to prevent efficiently the gas in the tube 111 from flowing out to exterior or to prevent efficiently the foreign matter of exterior from flowing in the tube 111. And the process gas supply line 132 or the exhaust line 143 may not be provided in the tube 111, which may improve space efficiency of the interior of the tube 111.

Here, the spray nozzles 131, the substrates S, and the exhaust openings 141 may be positioned along the same line. Thus, since the lower surfaces of the substrates S may maintain a floating state by the support tips, the process gas sprayed from the spray nozzles 131 may pass the substrates S and may be absorbed in the exhaust openings 141 to become a Laminar Flow. That is, the process gas may contact to the side surface of the substrates S, may move along the upper surface and the lower surface of the substrates S, and may flow in the exhaust openings 141. Thus, since the process gas flows parallel to the substrates S, the process gas may be supplied uniformly onto the upper surface of the substrates S.

In case that a processing process for substrates S is in progress with forming a Laminar Flow, controlling the current or flowage of the process gas may be critical. Thus, the flowage adjustment portion 190 may be provided to adjust the flowage of the process gas and to induce more amount of the process gas to participate actually in the processing process for the substrates S.

Referring to FIG. 3 and FIG. 4, the flowage adjustment portion 190 may be disposed between the tube 111 and the exterior tube 112 and may take a role of adjusting the flowage of the process gas by spraying the adjusting gas in a direction intersecting the moving direction of the process gas. The flowage adjustment portion 190 may include a plurality of spray openings 191 formed on the side of the tube 111 at different heights each corresponding to each of the processing spaces, a duct 192 installed on an exterior surface of the tube 111 to provide a flowage space for the adjusting gas to move to the spray openings 191, an adjusting gas supply line 193 connected to the duct 192 to spray the adjusting gas, and an adjusting valve (not shown) for adjusting a flow rate of the adjusting gas moving along the adjusting gas supply line 193.

Here, as an adjusting gas, hydrogen and so on may be used which does not influence the processing process for the substrates S, or which does not participate actually in the processing process for the substrates S. The adjusting gas may be a gas of the same ingredient as a carrier gas included in the process gas. Thus, since the ratio of carrier gas in the process gas may be controlled by controlling the amount of the adjusting gas, a mixing ratio of the process gas may be controlled by the adjusting gas. However, the type of the adjusting gas may not be limited to the above and various gas that does not influence the processing process of the substrates S may be used.

The spray openings 191 may be formed along the circumference of the tube 111 between the spray nozzles 131 and the exhaust openings 141. That is, the spray openings 191 may be disposed between the spray nozzles 131 and the exhaust openings 141 for the adjusting gas to be sprayed in a direction intersecting the direction the process gas is sprayed. The spray openings 191 may be provided in plurality and may be formed on the tube 111 at different heights each corresponding to each of the processing spaces. Thus, the flowage of the process gas at each of the processing spaces may be controlled to increase the amount of the process gas supplied onto the upper surface of the substrates S.

And the plurality of the spray openings 191 may be disposed at the same heights as the plurality of the spray nozzles 131. That is, each of the spray openings 191 may be formed at the same heights as the spray nozzles 131 and the substrates S. Thus, when the adjusting gas sprayed from the spray openings 191 does not meet the process gas moving along the circumference of the substrates S, or when the process gas and the adjusting gas are sprayed at different heights each other, it may be difficult for the adjusting gas to push the process gas.

Thus, the spray openings 191 and the spray nozzles 131 may be disposed at the same height for the process gas and the adjusting gas to spray at the same height. Therefore, the process gas which does not participate the processing process for the substrates S may be pushed with ease to the central portion of the substrates S. When the flowage of the process gas is adjusted by the adjusting gas with ease, the amount of the process gas contacting the upper surface of the substrates S may be increased to increase the amount of the process gas actually participating in the processing process for the substrates S.

And the spray openings 191 may be formed in the shape of a slit or in the shape of a plurality of holes disposed in line. Thus, the adjusting gas may push the process gas which is sprayed toward the side circumference of the substrates S and is moving along the circumference of the substrates S toward a central portion of the substrates S. Therefore, more amount of process gas may be supplied to the upper surface of the substrates S to participate actually in the processing process for the substrates S.

And the spray openings 191 may be changed in width as it goes from the gas supply portion 130 to the exhaust portion 140. That is, the width of the spray openings 191 may be increased or decreased as it goes from the spray nozzles 131 to the exhaust openings 141. Thus, the amount of the adjusting gas sprayed from a portion in close proximity to the gas supply portion 130 and the amount of the adjusting gas sprayed from a portion in close proximity to the exhaust openings 140 may be controlled to be different each other.

For example, during the movement of the process gas from the spray nozzles 131 to the exhaust openings 141, the reaction at the substrate in close proximity to the spray nozzles 131 may occur in advance, which may cause the thickness of the thin film at a portion in close proximity to the spray nozzles 131 thicker than that at a portion remote from the spray nozzles 131. Thus, to increase the amount of the adjusting gas supplied to a portion of the substrates S disposed remote from the spray nozzles 131 or to a portion of the substrates S in close proximity to the exhaust portion 140, the spray openings 191 may be formed to have width increased as it goes from the gas supply portion 130 to the exhaust portion 140.

That is, the amount of the adjusting gas sprayed from a portion with larger width may be larger than that sprayed from a portion with smaller width. Thus, more amount of the adjusting gas may be sprayed to a portion in close proximity to the exhaust openings 141, which may induce more amount of the process gas to move to a portion of the substrates S in close proximity to the exhaust openings 141. Therefore, the process gas may react with the surface of the substrates S at a portion of the substrates S in close proximity to the exhaust portion 140 to form a thin film of uniform thickness over the overall substrates S.

And the plurality of the spray openings 191 may have different areas according to height and the area may be increased or decreased as it goes from the upper side to the lower side. That is, the size or the density of the spray openings 191 may be adjusted to control the amount of the adjusting gas supplied to each of the processing spaces.

For example, because of the supply pressure of the adjusting gas, the amount of the adjusting gas sprayed from the spray openings 191 at the upper side may different from that sprayed from the spray openings 191 at the lower side. That is, though the spray openings 191 at the upper side and at the lower side may be formed in the same size, the amount of the adjusting gas sprayed from the spray openings 191 at the upper side may be smaller than that sprayed from the spray openings 191 at the lower side. Thus, the size of the spray openings 191 may be made smaller as it goes from the upper side to the lower side. Therefore, the amount of the adjusting gas sprayed from the spray openings 191 at the upper side may be increased and the amount of the adjusting gas sprayed from the spray openings 191 at the lower side may be decreased, by which the amount of the adjusting gas supplied to each of the processing spaces may become uniform.

Alternatively, the density of the spray openings 191 may be adjusted. That is, the number of holes included in the spray openings 191 may be differed. The number of holes provided to the spray openings 191 disposed at the upper side may be increased and the number of holes provided to that at the lower side may be decreased. Thus, the amount of the adjusting gas sprayed from the spray openings 191 at the upper side may be increased and the amount of the adjusting gas sprayed from the spray openings 191 at the lower side may be decreased, by which the amount of the adjusting gas sprayed to each of the processing spaces may become uniform.

And the spray openings 191 may be formed on both sides of the tube 111 and may be disposed to face each other. That is, the spray openings 191 may be disposed both sides between the spray nozzles 131 and the exhaust openings 141. For example, in case that the spray openings 191 are provided at only left side of the tube 111, the adjusting gas sprayed in a direction from left side to right side may push the process gas to only right side. Thus, the process gas cannot be supplied to a central portion of the substrates S but may be supplied to a right side of the substrates S, which cause efficiency of the processing process for the substrates S declined.

Thus, the spray openings 191 may be formed on the left side and right side of the tube 111 to face each other as shown in FIG. 5. That is, the adjusting gas sprayed from left side may push the process gas moving along the left side circumference of the substrates S to the central portion of the substrates S and the adjusting gas sprayed from right side may push the process gas moving along the right side circumference of the substrates S to the central portion of the substrates S, by which the process gases may meet at the central portion of the substrates S and the process gas may be focused at the central portion of the substrates S. Thus, the amount of process gas actually participating in the processing process for the substrates S at the upper surface of the central portion of the substrates S may be increased to improve efficiency of the processing process for the substrates S. However, the structure and shape of the spray openings 191 may not be limited to the above and may be various.

The duct 192 may be installed on an exterior surface of the tube 111 and interior of the duct 192 may form a space in which the adjusting gas may flow. That is, interior of the duct 192 may provide a flowage space for the adjusting gas to move to the spray openings 191. And the duct 192 may be disposed to cover the spray openings 191, by which the interior of the duct 192 and the interior of the tube 111 may communicate each other through the spray openings 191. Thus, when the adjusting gas is supplied in the duct 192, the adjusting gas may be sprayed into the tube 111 through the spray openings 191.

The duct 192 may be provided in a pair and may be disposed to face each other. That is, the duct 192 may be installed on each of both sides of the tube 111 corresponding to the spray openings 191 formed on both sides of the tube 111. Thus, the duct 192 may supply the adjusting gas to the spray openings 191. However, the structure and shape of the duct may not be limited to the above and may be various.

The adjusting gas supply line 193 may be formed in a pipe shape, one end of which may be connected to the duct 192 and the other end of which may be connected to an adjusting gas supply source (not shown). Thus, the adjusting gas supplied from the adjusting gas supply source may be supplied to the duct 192 through the adjusting gas supply line 193. For example, the adjusting gas supply line 193 may have one end extending along the process gas supply line 132, may diverge at a space between the tube 111 and the exterior tube 112, and each may be connected to the duct 192 of both sides.

And the adjusting gas supply line 193 may be connected to the upper side of the duct 192. Thus, the adjusting gas may be charged from the upper side of the duct 192 to the lower side of the duct 192. That is, when the adjusting gas is charged from the lower side of the duct 192, it may be difficult for the adjusting gas to move to the upper side of the duct 192, by which the amount of the adjusting gas sprayed from the spray openings 191 at the upper side may become small and the amount of the adjusting gas sprayed from the spray openings 191 at the lower side may become large. Thus, the amount of the adjusting gas supplied to the substrates S of the upper side and to the substrates S of the lower side may become different and the position on the substrates S of the upper side at which the process gas is focused and the position on the substrates S of the lower side at which the process gas is focused may be different, by which the thickness of the thin film on the substrates S of the upper side and the thickness of the thin film on the substrates S of the lower side may not become uniform.

When the adjusting gas is charged from the upper side of the duct 192, it may be easy for the adjusting gas to move to the lower side of the duct 192, by which the adjusting gas may move to the lower side and may be sprayed to each of the plurality of the substrates S through the plurality of the spray openings 191. Thus, the amount of the adjusting gas sprayed from the spray openings 191 of the upper side and from the spray openings 191 of the lower side may be uniform. Thus, the position of the substrates S of the upper side at which the process gas is focused and the position of the substrates S of the lower side at which the process gas is focused may become identical or similar each other, by which the thickness of the thin film of the substrates S of the upper side and the thickness of the thin film of the substrates S of the lower side may be adjusted to become uniform.

On the other hand, as shown in FIG. 6, the flowage adjustment portion 190 may further include a spray unit 195 disposed in the duct 192 and connected to the adjusting gas supply line 193 to spray the adjusting gas into the duct 192. The spray unit 195 may be formed in a pipe shape formed to stretch in a vertical direction and may have a plurality of holes in line in a vertical direction. The plurality of holes provided to the spray unit 195 may be disposed vertically corresponding to the positions of the spray openings 191. Thus, the spray unit 195 may spray the adjusting gas corresponding to each of the processing spaces into the duct 192.

And the adjusting gas supply line 193 may be connected to the lower side of the spray unit 195 passing through the duct 192. Thus, the adjusting gas moving in the adjusting gas supply line 193 may be supplied to the spray unit 195 and the adjusting gas may be supplied uniformly into the duct 192 through the holes of the spray unit 195, by which the adjusting gas may be supplied to each of the substrates S at an uniform amount through the spray openings 191 provided to the duct 192. That is, since the adjusting gas of uniform amount may be sprayed from the holes of the spray unit 195, the problem that the amount of the adjusting gas sprayed from the spray openings 191 vary according to the height may be minimized. Thus, the adjusting gas of uniform amount may be sprayed onto the plurality of the substrates S and the thickness of the thin film of the substrates S of the upper side and that of substrates S of the lower side may be adjusted to become uniform.

For example, the plurality of holes of the spray unit 195 may be formed to vary in width according to the height. That is, the width of the holes may be increased or decreased as it goes from the upper side to the lower side. Thus, it may be adjusted for the adjusting gas of uniform amount to be sprayed regardless of the height. However, the method for supplying the adjusting gas into the duct 192 may not be limited to the above and may be various.

The adjusting valve may be installed on the adjusting gas supply line 193 and may take a role of controlling the flow rate of the adjusting gas moving in the adjusting gas supply line 193. Thus, the amount of the adjusting gas sprayed into the tube 111 may be controlled according to the process and efficiency of the process may be improved.

For example, in case that the thickness of the thin film formed on the central portion of the substrates S is thicker than the thickness of the thin film formed on the outskirts portion of the substrates S, the adjusting valve may be controlled to decrease the amount of the adjusting gas supplied to the duct 192. Thus, the amount of the adjusting gas pushing the process gas to the central portion of the substrates S may be decreased, by which the amount of the process gas being pushed to the central portion of the substrates S may be decreased and the amount of the process gas being supplied to the outskirts portion of the substrates S may be increased. Thus, the reaction with the process gas at the outskirts portion of the substrates S may occur more vivid than that at the central portion to form a thin film of uniform thickness on the substrates S.

On the contrary, in case that the thickness of the thin film formed on the outskirts portion of the substrates S is thicker than the thickness of the thin film formed on the central portion of the substrates S, the adjusting valve may be controlled to increase the amount of the adjusting gas supplied to the duct 192. Thus, the amount of the adjusting gas pushing the process gas to the central portion of the substrates S may be increased, by which more amount of the process gas may be focused to the central portion of the substrates S and the amount of the process gas supplied to the outskirts portion of the substrates S may be decreased. Thus, the reaction with the process gas at the central portion of the substrates S may occur more vivid than that at the outskirts portion to form a thin film of uniform thickness on the substrates S.

As described above, the flowage adjustment portion 190 may be provided in the substrate processing apparatus 100 to adjust the flowage of the process gas. That is, the flowage adjustment portion 190 may adjust the flowage of the process gas moving along the circumference of the substrates S to heading to the central portion of the substrates. Thus, most of the process gas may participate in the processing process for the substrates S, by which the amount of wasted process gas may be decreased and efficiency of the processing process for the substrates may be increased.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of Symbols> | |
|---|---|
| 100: substrate processing apparatus | 111: tube |
| 112: exterior tube | 120: chamber |
| 130: gas supply portion | 140: exhaust portion |
| 190: flowage adjustment portion | 191: spray openings |
| 192: duct | 193: adjusting gas supply line |
| 195: spray unit | |

What is claimed is:

1. A substrate processing apparatus, comprising:
a tube providing an interior space in which substrates can be processed;
a substrate support portion for stacking a plurality of substrates in an interior space of the tube;
a gas supply portion for supplying a process gas to the plurality of substrates;
an exhaust portion disposed to face the gas supply portion to absorb the process gas; and
a flowage adjustment portion having spray openings formed along a circumference of the tube between the gas supply portion and the exhaust portion to spray an adjusting gas,
wherein the spray openings are formed on both sides of the tube, respectively, and are disposed to face each other in order to spray the adjusting gas in a direction crossing a direction in which the process gas is sprayed.

2. The substrate processing apparatus according to claim 1, further comprising,
an exterior tube accommodating the tube therein,
wherein the flowage adjustment portion is disposed between the tube and the exterior tube.

3. The substrate processing apparatus according to claim 1, wherein the substrate support portion further comprises:
a plurality of isolation plates each disposed between the substrates along a loaded direction of the substrates to divide the processing spaces for processing each of the plurality of substrates; and
a plurality of spray openings are formed on the tube at different heights corresponding to each of the processing spaces.

4. The substrate processing apparatus according to claim 1, wherein the flowage adjustment portion further comprises:
a duct installed on an exterior surface of the tube to provide a flowage space for the adjusting gas to move to the spray openings; and
an adjusting gas supply line connected to the duct to supply the adjusting gas.

5. The substrate processing apparatus according to claim 4, wherein the flowage adjustment portion further comprises a spray unit disposed inside of the duct to spray the adjusting gas inside of the duct corresponding to each of the processing spaces and connected to the adjusting gas supply line.

6. The substrate processing apparatus according to claim 1, wherein the spray openings are formed in a shape of a slit or in a shape of a plurality of holes disposed in line.

7. The substrate processing apparatus according to claim 6, wherein the spray openings are changed in width as going from the gas supply portion to the exhaust portion.

8. The substrate processing apparatus according to claim 3, wherein the plurality of spray openings have a different area according to height.

9. The substrate processing apparatus according to claim 3, wherein the plurality of spray openings are disposed at the same height as each of a plurality of spray nozzles spraying the process gas of the gas supply portion.

* * * * *